(12) United States Patent
Kane et al.

(10) Patent No.: US 6,703,641 B2
(45) Date of Patent: Mar. 9, 2004

(54) STRUCTURE FOR DETECTING CHARGING EFFECTS IN DEVICE PROCESSING

(75) Inventors: Terence L. Kane, Wappingers Falls, NY (US); Yun Yu Wang, Poughquag, NY (US); Malcolm P. Cambra, Jr., Palm Bay, FL (US); Michael P. Tenney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/991,507

(22) Filed: Nov. 16, 2001

(65) Prior Publication Data

US 2003/0094609 A1 May 22, 2003

(51) Int. Cl.$^7$ .............................................. H01L 23/58
(52) U.S. Cl. .................... 257/48; 257/202; 257/206; 257/208; 257/347; 257/348; 257/349; 257/350; 257/351; 257/352; 257/353; 257/354; 257/374; 257/401; 257/903
(58) Field of Search ................... 257/48, 347, 348–354, 257/202, 206, 208, 374, 401, 903

(56) References Cited

U.S. PATENT DOCUMENTS

| | | | |
|---|---|---|---|
| 5,315,145 A | | 5/1994 | Lukaszek |
| 5,332,903 A | | 7/1994 | Buehler et al. |
| 5,684,311 A | * | 11/1997 | Shaw .......................... 257/206 |
| 5,698,872 A | * | 12/1997 | Takase et al. ................ 257/206 |
| 5,753,920 A | | 5/1998 | Buehler et al. |
| 5,861,634 A | | 1/1999 | Hsu et al. |
| 5,869,877 A | | 2/1999 | Patrick et al. |
| 5,898,206 A | * | 4/1999 | Yamamoto ................... 257/360 |
| 5,930,663 A | * | 7/1999 | Baukus et al. ............... 438/598 |
| 6,028,324 A | | 2/2000 | Su et al. |
| 6,037,638 A | * | 3/2000 | Abe et al. ..................... 257/393 |
| 6,078,058 A | | 6/2000 | Hsu et al. |
| 6,160,298 A | * | 12/2000 | Ohkubo ....................... 257/393 |
| 6,194,252 B1 | * | 2/2001 | Yamaguchi .................. 438/129 |
| 6,291,835 B1 | * | 9/2001 | Tsuji et al. .................... 257/48 |
| 6,376,285 B1 | * | 4/2002 | Joyner et al. ................ 438/149 |
| 6,407,425 B1 | * | 6/2002 | Babcock et al. ............. 257/318 |
| 6,445,049 B1 | * | 9/2002 | Iranmanesh .................. 257/401 |
| 2001/0023949 A1 | * | 9/2001 | Johnson et al. .............. 257/222 |
| 2001/0045670 A1 | * | 11/2001 | Nojiri .......................... 257/786 |
| 2002/0034841 A1 | * | 3/2002 | Lee .............................. 438/149 |
| 2002/0089031 A1 | * | 7/2002 | Ang et al. .................... 257/506 |

FOREIGN PATENT DOCUMENTS

| | | |
|---|---|---|
| JP | 64-69025 | 3/1989 |
| JP | 4-278559 | 10/1992 |
| JP | 6-349920 | 12/1994 |
| JP | 11-238774 | 8/1999 |

OTHER PUBLICATIONS

Monitoring Floating–Body Charge in PD/SOI CMOS Devices, J.B. Kuang, M.J. Saccamango, and S. Ratanaphanyarat, IBM Corporation, Advanced Server Development—Symp. VLSI Circuits, Jun. 2001.

* cited by examiner

Primary Examiner—Amir Zarabian
Assistant Examiner—Ida M. Soward
(74) Attorney, Agent, or Firm—James J. Cioffi

(57) ABSTRACT

A semiconductor device monitor structure is described which can detect localized defects due to floating-body effects, particularly on SOI device wafers. The monitor structure includes a plurality of cells containing PFET or NFET devices, disposed at a perimeter of the structure which is bordered by an insulating region such as shallow trench isolation (STI). Each cell includes polysilicon gate structures having a characteristic spacing given by a first distance, and a portion extending beyond the perimeter a second distance. The cells are constructed in accordance with progressively varying ground rules, so that the first distance and second distance are non-uniform between cells. The cells may be bit fail mapped for single-cell failures, thereby enabling detection of localized defects due to floating-body effects.

9 Claims, 6 Drawing Sheets

STRUCTURE FOR DETECTING CHARGING EFFECTS IN DEVICE PROCESSING

FIELD OF THE INVENTION

This invention relates to semiconductor processing and testing, and more particularly to an in-line monitor structure sensitive to charging effects associated with various device processing methods including plasma processes.

BACKGROUND OF THE INVENTION

In the manufacture of devices on a semiconductor wafer, a number of processes presently in use involve plasmas or particle beams incident on the wafer surface. Examples of such processes include plasma sputtering, reactive ion etching, plasma etching, ionized phase vapor deposition, e-beam processing and ion implantation. It is known that devices built with SOI (silicon-on-insulator) technology are susceptible to damage resulting from the manufacturing processes (see T. Poiroux et al., "Plasma process induced damage in SOI devices," IEDM November 1999). In particular, these processes may cause localized buildup of electrical charge in the silicon device layer. This charge buildup (also called floating-body effect) can compromise device performance, as well as introduce changes in device characteristics that are difficult to detect. This problem is especially acute in processes employing a hollow cathode magnetron, ionized phase vapor deposition, or other apparatus in which the wafer is subjected to a DC bias.

Electrical testing of devices while the devices are still on the manufacturing line ("in-line monitoring") is typically done using monitor structures located in the kerf areas between chips. For example, as shown in FIG. 1A, the kerf area 2 between chips 1 is populated with monitor structures 3. An effective monitor structure must be sensitive to any effects which may result in failure of the chips. There is a need for a monitor structure which is capable of detecting subtle, localized charging effects due to plasma processing in SOI technologies.

SUMMARY OF THE INVENTION

The present invention addresses the above-described need by providing a semiconductor device monitor structure which can detect localized defects due to floating-body effects, particularly on SOI device wafers.

The monitor structure of the present invention comprises a plurality of cells containing FET devices; the cells are disposed at a perimeter of the structure. Each of the cells includes polysilicon gate structures having a characteristic spacing given by a first distance, and a portion extending beyond the perimeter a second distance. The first distance and said second distance are non-uniform between cells in the structure (as in the case of cells constructed in accordance with progressively varying ground rules). This monitor structure may be bordered by an insulating region such as a shallow trench isolation (STI) region, with the portion extending beyond the perimeter extending into the STI region. The FET devices may be either PFET or NFET devices. The cells may advantageously be bit fail mapped for single-cell failures, thereby enabling detection of localized defects due to floating-body effects. In addition, the cells may be viewed as comprising an SRAM cache, so that an SRAM cache failure indicates a defect due to floating-body effects.

DETAILED DESCRIPTION OF THE PREFERRED EMBODIMENTS

In accordance with the present invention, an in-line monitor structure 3 is provided in the kerf region between chips. The monitor structure is typically at a location bordered by an insulating region, such as a shallow trench isolation (STI) region. The monitor structure and the insulating region respond differently to plasma treatment.

Figure 1A:
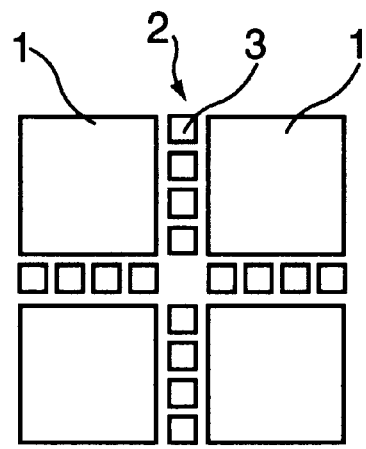
FIG. 1A shows a typical arrangement of in-line monitor structures in the kerf region between chips on a semiconductor wafer.
Figure 1B:
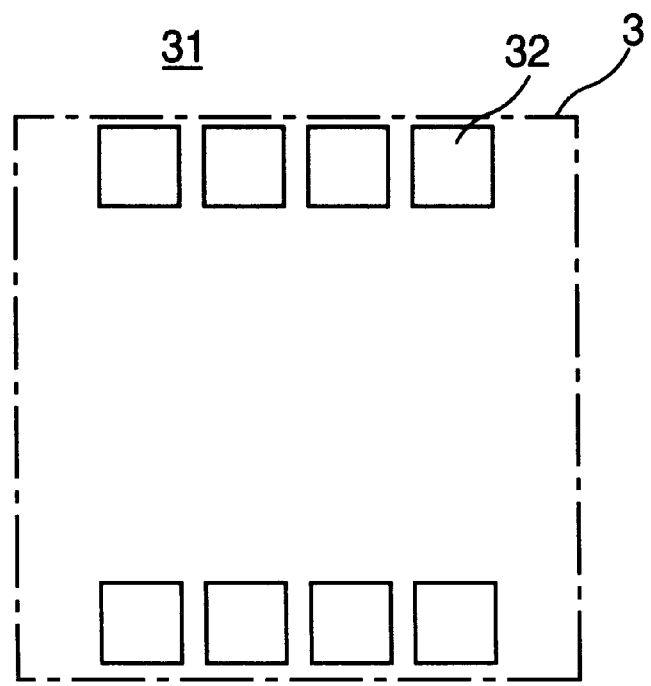
FIG. 1B shows an in-line monitor structure for use in SOI technology, with SRAM cells at the perimeter thereof.

In a preferred embodiment, shown schematically in FIG. 1B, the monitor structure 3 is surrounded by a shallow trench isolation (STI) region 31. The monitor structure 3 is an SRAM cache with SRAM cells 32 arranged at the perimeter of the cache structure.

Figure 2A:
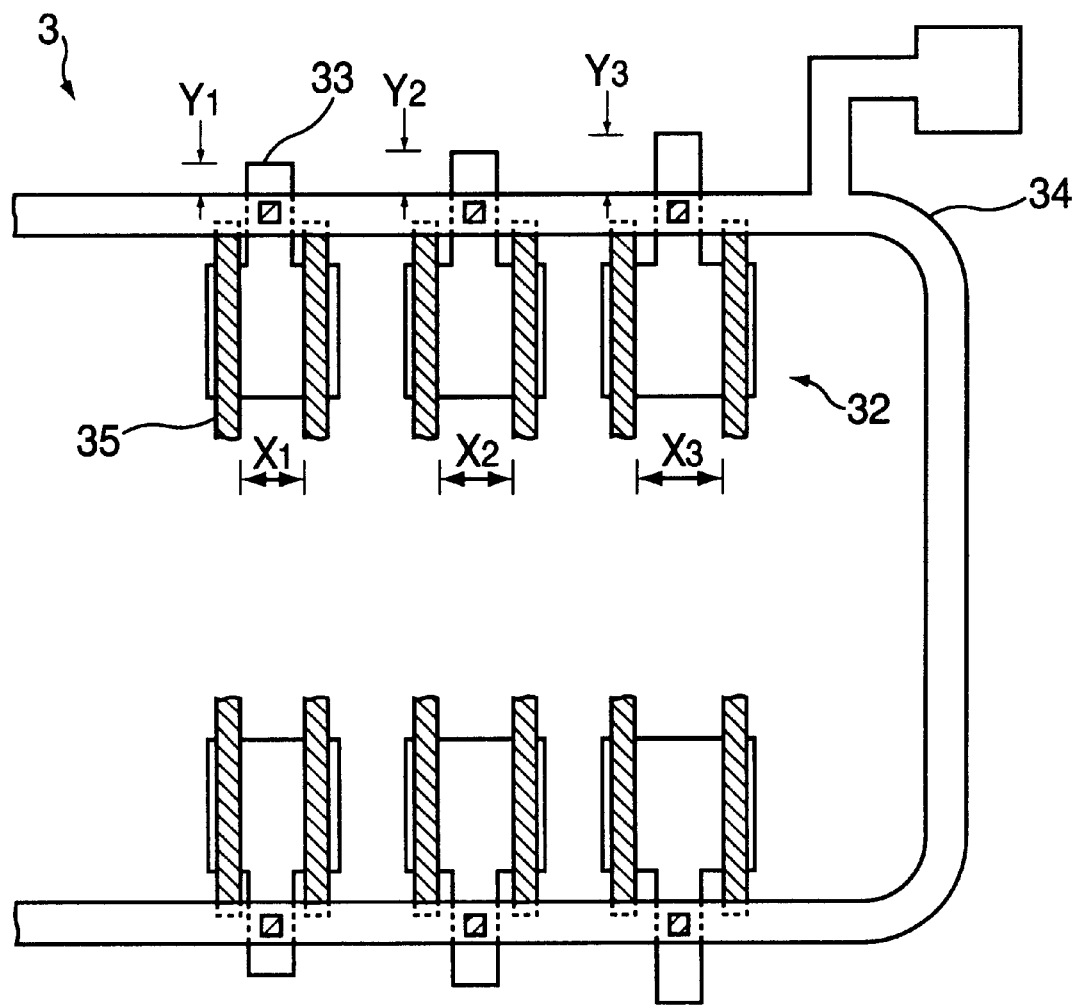
FIG. 2A shows the general layout of SRAM cells in an inline monitor structure, in accordance with the invention.

FIG. 2A shows further details of the layout of SRAM cells 32. (It will be appreciated that the figures are not intended to show all details of the SRAM cells, but only those which embody features of the invention. In particular, only the portion of the cell at the perimeter of the monitor structure is shown.) Each cell connects to metal line 34 and may be electrically probed using pad 36. The cells include PFET devices, with a portion 33 of each PFET extending into the surrounding STI region 31. Each PFET also includes polysilicon gate structures 35; the PFET is characterized by the spacing x between polysilicon structures 35. Similarly, portion 33 of each PFET extends into the STI by a distance y.

Figure 2B:
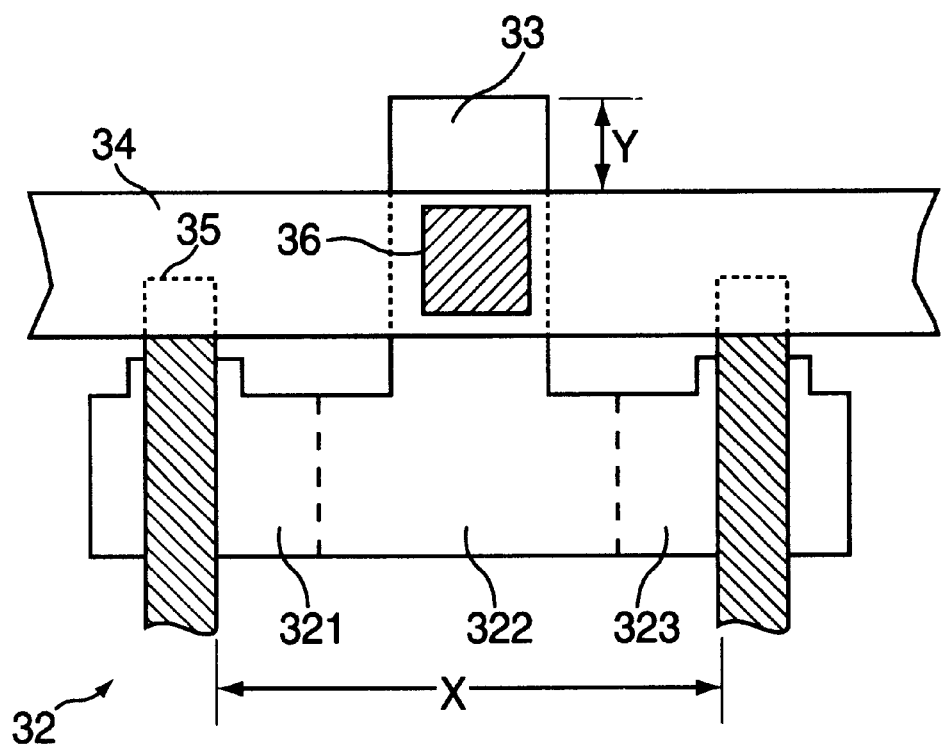
FIG. 2B shows details of an SRAM cell layout with variable spacing between polysilicon gates, in accordance with the invention.

Unlike a conventional array of cells, the array of SRAM cells 32 has progressively varying ground rules; that is, distances x and y are not uniform but vary from one SRAM cell to another. In the example of FIG. 2B, $x_3 > x_2 > x_1$ and $y_3 > y_2 > y_1$. This arrangement permits measurement of the varying effects of process-induced localized charge buildup in the SOI devices.

Figure 3:
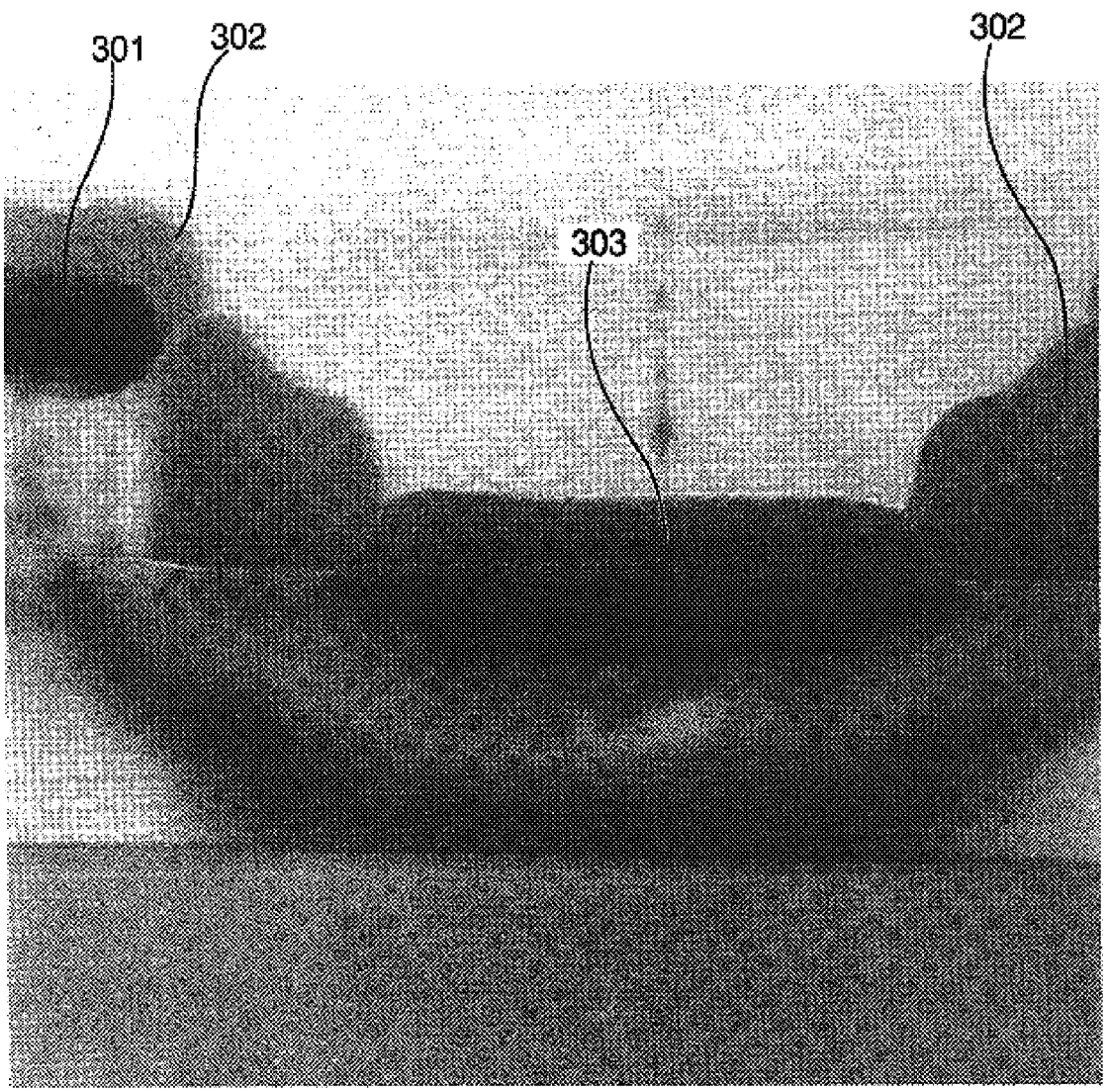
FIG. 3 is a TEM photograph of a minimum-spacing monitoring device.

A detail view of a PFET device bordering the STI is given in FIG. 2B. The device includes regions 321 and 323 having polysilicon gate structures 35, having a spacing x. These regions are separated by region 322, a portion 33 of which extends into the STI a distance y. Regions 321 and 323 also include gate sidewall structures, typically of silicon nitride. Region 322, constructed in accordance with SOI technology, often includes a diffusion barrier such as $CoSi_2$. These features are shown in cross section in FIG. 3. The polysilicon is visible at 301; two sidewalls 302 face each other with $CoSi_2$ layer 303 therebetween.

It will be appreciated that the SRAM cache structure 3 typically includes both PFET and NFET devices. Accordingly, the above-described structure may also be realized using NFET devices on the perimeter of the monitor structure.

The progressively sized spacings x between polysilicon structures 35 permit testing of the effectiveness of sidewall nitride sputter clean processing, and of the uniformity and stoichiometry of the cobalt silicide film.

The SRAM cells 32, with varying ground rules and varying x and y, are bit fail mapped for single-cell failures. This permits pinpointing of specific device failures indicative of charge-related defects.

In addition, single-bit errors resulting from frequency-related defects may be pinpointed using this structure. A smaller spacing x, or a larger extension y, results in the cell having greater sensitivity to frequency-related defects.

Furthermore, SRAM gate oxide defects due to process-induced charge buildup may be detected because of the high density of the SRAM cells 32 and the ease with which bit fail mapping localizes failing devices. This in turn permits detection of abnormal, localized charging of wafers in a processing chamber.

Figure 4:
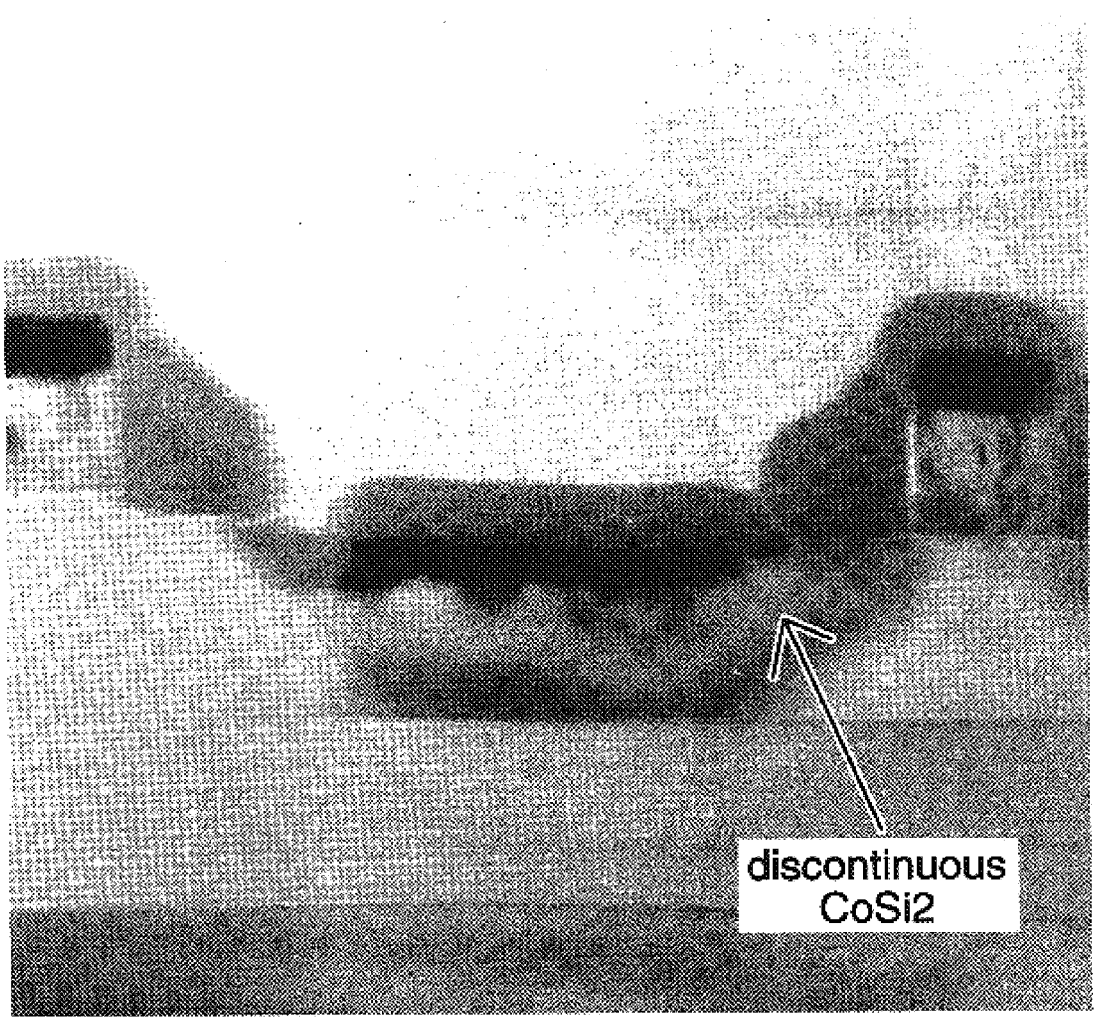
FIG. 4 is a TEM photograph of a monitoring device according to the invention, showing an example of process-related device failure.

FIG. 4 is a cross-sectional view of a defective device that may be pinpointed using the present invention. In the processing of this device, diffusion of nitrogen into the silicon has prevented cobalt from fully reacting with the silicon, so that the $CoSi_2$ layer is discontinuous (compare FIG. 3). The nitrogen diffusion may be reduced by eliminating an $N_2$ purge from the process chamber in which the Co is sputtered onto the wafer.

Figure 5:
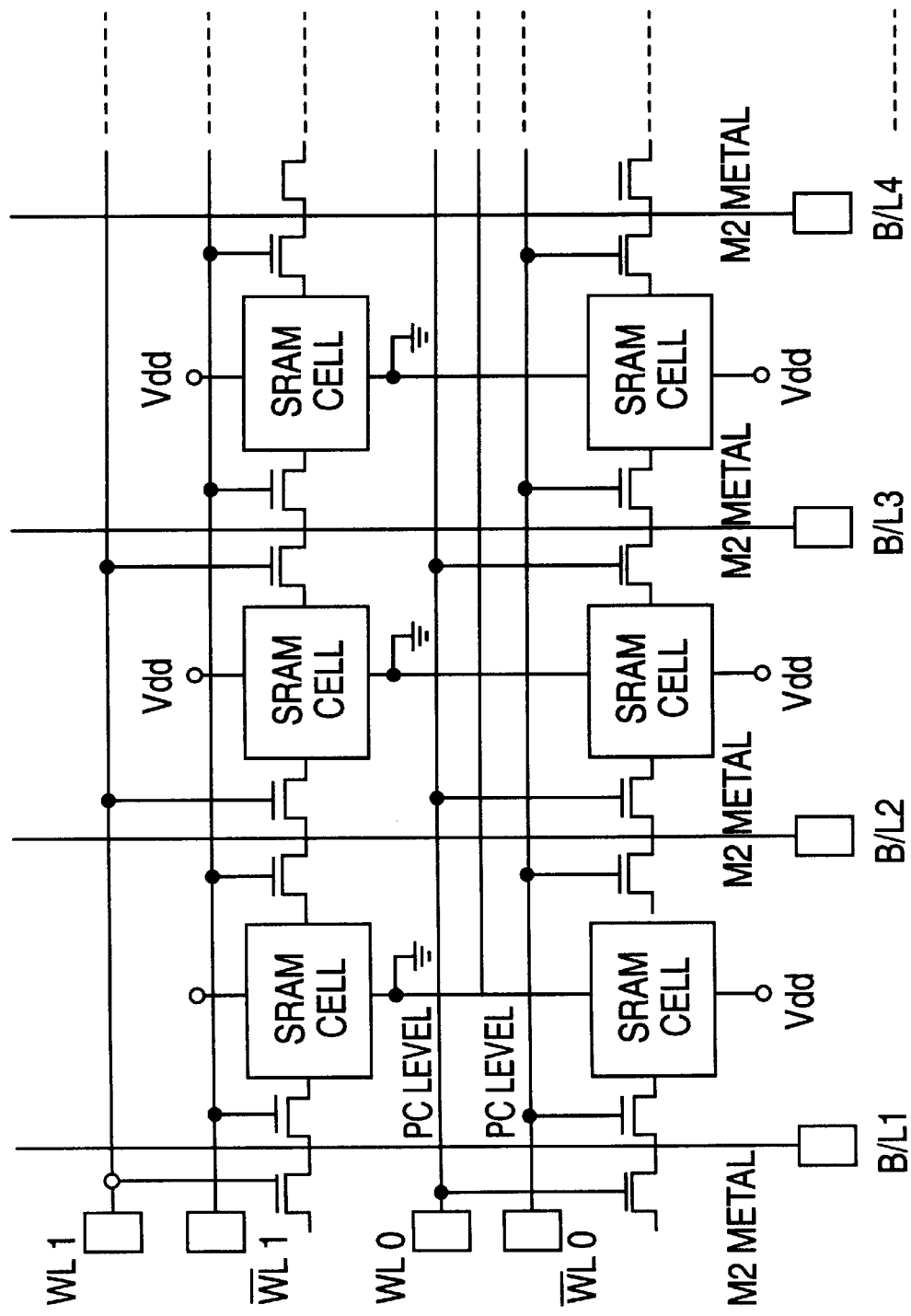
FIG. 5 is an electrical schematic of the in-line monitor structure according to the invention, showing the arrangement of SRAM cells therein.

FIG. 5 is an electrical schematic of the in-line monitor structure, showing the connections between the word lines and the SRAM cells. It has been found that process-induced charge buildup is manifested by word line zero (WL0) cache failures, because the SRAM cells constituting the WL0 cache are typically at the perimeter of the structure and are thus closest to the insulating region.

It should be noted that the in-line monitor structure is designed to mimic the worst-case features of the actual chip design; that is, the monitor structure is more sensitive to process-induced defects, and thus more susceptible to single-cell failures and/or cache failures.

The above-described monitor structure is particularly useful in detecting defects in SOI technology. It will be appreciated, however, that the invention is not limited to SOI devices.

While the invention has been described in terms of a specific embodiment, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A semiconductor device monitor structure comprising:

a plurality of cells containing FED devices, said cells being disposed at a perimeter of the structure, wherein each of said cells includes polysilicon gate structures having a characteristic spacing between said polysilicon gate structures, said characteristic spacing having a first direction and distance, said first distance being non-uniform between cells in said structure;

each of said cells having a portion of said polysilicon gate structures extending beyond the perimeter a second direction and distance, said second direction being substantially perpendicular to said first direction within each of said cells, and said second distance being non-uniform between cells in said structure, a metal line connecting said plurality of cells, and an electrical probe pad in each cell positioned on said metal line between said polysilicon gate structures.

2. A semiconductor device monitor structure according to claim 1, wherein said structure is formed on a wafer having silicon-on-insulator (SOI) devices.

3. A semiconductor device monitor structure according to claim 2, wherein said structure is surrounded by a shallow trench isolation (STI) region, and the portion extending beyond the perimeter extends into said STI region.

4. A semiconductor device monitor structure according to claim 1, wherein the FET devices are PFET devices.

5. A semiconductor device monitor structure according to claim 1, wherein the FET devices are NFET devices.

6. A semiconductor device monitor structure according to claim 1, wherein detection of a single-cell failure indicates a defect due to floating-body effects.

7. A semiconductor device monitor structure according to claim 1, wherein said first distance and said second distance progressively increase from cell to cell in said plurality of cells.

8. A semiconductor device monitor structure according to claim 1, wherein said cells comprise an SRAM cache, so that an SRAM cache failure indicates a defect due to floating-body effects.

9. A semiconductor device monitor structure according to claim 1, wherein said structure is provided in the kerf region between chips on a wafer.

* * * * *